United States Patent [19]
Disney

[11] Patent Number: 6,127,701
[45] Date of Patent: Oct. 3, 2000

[54] VERTICAL POWER DEVICE WITH INTEGRATED CONTROL CIRCUITRY

[75] Inventor: Donald Ray Disney, Kokomo, Ind.

[73] Assignee: Delco Electronics Corporation, Kokomo, Ind.

[21] Appl. No.: 09/286,319

[22] Filed: Apr. 5, 1999

Related U.S. Application Data

[62] Division of application No. 08/999,796, Oct. 3, 1997, Pat. No. 5,994,188.

[51] Int. Cl.$^7$ .................................................. H01L 29/76
[52] U.S. Cl. ......................... 257/338; 257/327; 257/350; 257/67
[58] Field of Search ................................... 438/268, 273, 438/269; 257/329, 327, 328, 337, 338, 335, 340, 341, 67, 69, 350

[56] References Cited

U.S. PATENT DOCUMENTS

| | | | |
|---|---|---|---|
| 4,644,637 | 2/1987 | Temple | 148/DIG. 126 |
| 4,908,328 | 3/1990 | Hu et al. | 148/DIG. 135 |
| 4,987,098 | 1/1991 | Nishiura et al. | 148/DIG. 126 |
| 5,072,277 | 12/1991 | Sakakibara et al. | 257/351 |
| 5,079,607 | 1/1992 | Dakurai | 257/350 |
| 5,476,809 | 12/1995 | Kobayashi | 148/DIG. 12 |
| 5,547,886 | 8/1996 | Harada | 148/DIG. 126 |
| 5,627,399 | 5/1997 | Fujii | 357/350 |

*Primary Examiner*—Michael Trinh
*Attorney, Agent, or Firm*—Jimmy L. Funke

[57] ABSTRACT

A process for integrating a vertical power device, such as an IGBT device, with suitable control circuitry, such as circuitry that provides self-protection from over-temperature (OT), over-voltage (OV) and over-current (OC) conditions. The process yields a vertical power device that is monolithically integrated with, and dielectrically isolated from, its control circuitry with the use of wafer-bonded silicon-on-insulator (SOI) material that yields a buried oxide layer. The process includes simultaneous fabrication of the power device below the buried oxide layer and its control circuitry above the buried oxide layer, in the SOI layer.

5 Claims, 3 Drawing Sheets

VERTICAL POWER DEVICE WITH INTEGRATED CONTROL CIRCUITRY

This is a division of application Ser. No. 08/999,796 filed on Oct. 3, 1997, now U.S. Pat. No. 5,994,188.

FIELD OF THE INVENTION

The present invention generally relates to semiconductor devices and processes for their fabrication. More particularly, this invention relates to a vertical power semiconductor device that is monolithically integrated with, and dielectrically isolated from, logic and control circuitry for the device with the use of a silicon-on-insulator layer.

BACKGROUND OF THE INVENTION

The demand for high-voltage insulated-gate bipolar transistor (IGBT) devices for automotive electronics applications has increased dramatically, particularly for such applications as coil drivers for ignition systems and motor drivers for electric vehicles. Accompanying this increased demand is a desire for "smart" IGBT devices, i.e., IGBT devices that are monolithically integrated with control circuitry to provide self-protection from over-temperature (OT), over-voltage (OV) and over-current (OC) conditions. However, full integration of an IGBT device with its control circuitry is complicated by the high voltages at which IGBT devices must operate, often about 400 to 1400 volts, and because the level of minority carriers present with IGBT devices would interfere with the low-voltage control circuitry.

Several techniques have been suggested by which various electronic power devices can be integrated with suitable control circuitry. For example, relatively low-voltage (40 to 100 volts) vertical DMOS (double-diffused metal-oxide semiconductor) devices are commercially available that rely on junction-isolation (JI) to provide electrical insulation for their control circuitry. However, junction-isolation cannot adequately protect control circuitry from the minority carriers inherent with IGBT devices. Silicon-on-insulator (SOI) technologies, such as wafer-bonding and separation by implantation of oxygen (SIMOX), have been employed in the fabrication of DMOS devices to achieve dielectric-isolation (DI), a viable isolation technique for use with high-voltage IGBT devices. However, such techniques have proven to be costly and/or yield devices characterized by inadequate performance or reliability. The use of polysilicon thin-film transistors for the control circuitry of DMOS devices has also enabled the implementation of dielectric-isolation. However, a shortcoming of this approach is that the performance of polysilicon transistors is inferior to equivalent single-crystal devices. Similar efforts to achieve dielectric-isolation with polysilicon structures for high-voltage IGBT devices have generally incurred relatively high processing costs.

In view of the above, it would be desirable if a process were available that would enable the monolithic integration of an IGBT device with suitable control circuitry, in which the resulting device is characterized by effective isolation of the control circuitry at high operating voltages, high performance, and relatively low processing costs.

SUMMARY OF THE INVENTION

It is an object of this invention to provide a high-voltage semiconductor power device that is monolithically integrated with control circuitry that protects the device from adverse operating conditions.

It is another object of this invention to provide a process for the fabrication of such a device, in which novel techniques are combined with relatively standard processing methods in such a way as to achieve dielectric-isolation of the control circuitry from the device.

It is a further object of this invention that such a process is particularly well suited for fabricating IGBT devices having operating voltages of about 400 to 1400 volts.

In accordance with a preferred embodiment of this invention, these and other objects and advantages are accomplished as follows.

According to the present invention, there is provided a process for Integrating a vertical power device, such as an IGBT device, with suitable control circuitry, such as circuitry that provides self-protection from over-temperature (OT), over-voltage (OV) and over-current (OC) conditions. The process uniquely yields a vertical power device that is monolithically integrated with, and dielectrically isolated from, its control circuitry with the use of wafer-bonded silicon-on-insulator (SOI) material that yields a buried oxide layer. The process includes simultaneous fabrication of the power device below the buried oxide layer and its control circuitry above the buried oxide layer, in the SOI layer.

Generally, the process utilizes a first wafer that includes a silicon substrate, an oxide layer, and at least one epitaxial layer disposed between the oxide layer and the silicon substrate. The first wafer may further include a polysilicon layer underlying the dielectric layer and a second dielectric layer between the polysilicon layer and the epitaxial layer. A second, single-crystal silicon wafer is then bonded to the oxide layer of the first wafer, such that the oxide layer and the epitaxial layer are between the first and second wafers. As such, the oxide Layer forms a buried oxide layer between the first and second wafers.

A portion of the second wafer above the buried oxide layer is then completely removed, such that a portion of the first wafer projects from beneath the second wafer. During removal of the second wafer portion, the oxide layer on the exposed portion of the first wafer may also be removed to expose the underlying epitaxial layer. Alternatively, this region of the oxide layer can be etched to serve as a mask for implanting dopants into the epitaxial layer to form the vertical power device. With the above-described configuration, the vertical power device can be formed in the epitaxial layer of the exposed portion of the first wafer, and the control circuitry, simultaneously formed in the portion of the second wafer remaining on the first wafer. The buried oxide layer between the first and second wafers then serves as dielectric isolation between the vertical power device and the control circuitry. If present, the polysilicon layer of the first wafer can be grounded so as to provide a shielding layer between the first and second wafers.

The process described above results in the upper surface of the second wafer being spaced about one micrometer or more from the upper surface of the first wafer's epitaxial layer. According to this invention, a dual-plane lithographic technique is employed to simultaneously fabricate the power device in the first wafer and the control circuitry in the second wafer. Electrical connection between the power device is achieved either by wire-bonding or metallization.

As described above, the process of this invention provides a self-protected, monolithically-integrated power device capable of contributing to improved system performance and reliability. The use of wafer-bonded SOI starting material and limiting the complexity of the process and resulting devices yields a smart power device whose process and material costs are only slightly more than that of a conventional discrete power device. In addition to the process advantages of this invention, the starting materials for the first and second wafers can be independently specified in order to individually optimize the performances of the power device and the control circuitry. In addition, the SOI material and the buried oxide layer can be tailored for a given voltage capability and support a desired complement of devices for the control circuitry. Advantageously, both the SOI material and the buried oxide layer can be of high quality, since the buried oxide layer can be thermally grown on the first wafer and the second wafer can be single-crystal silicon.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
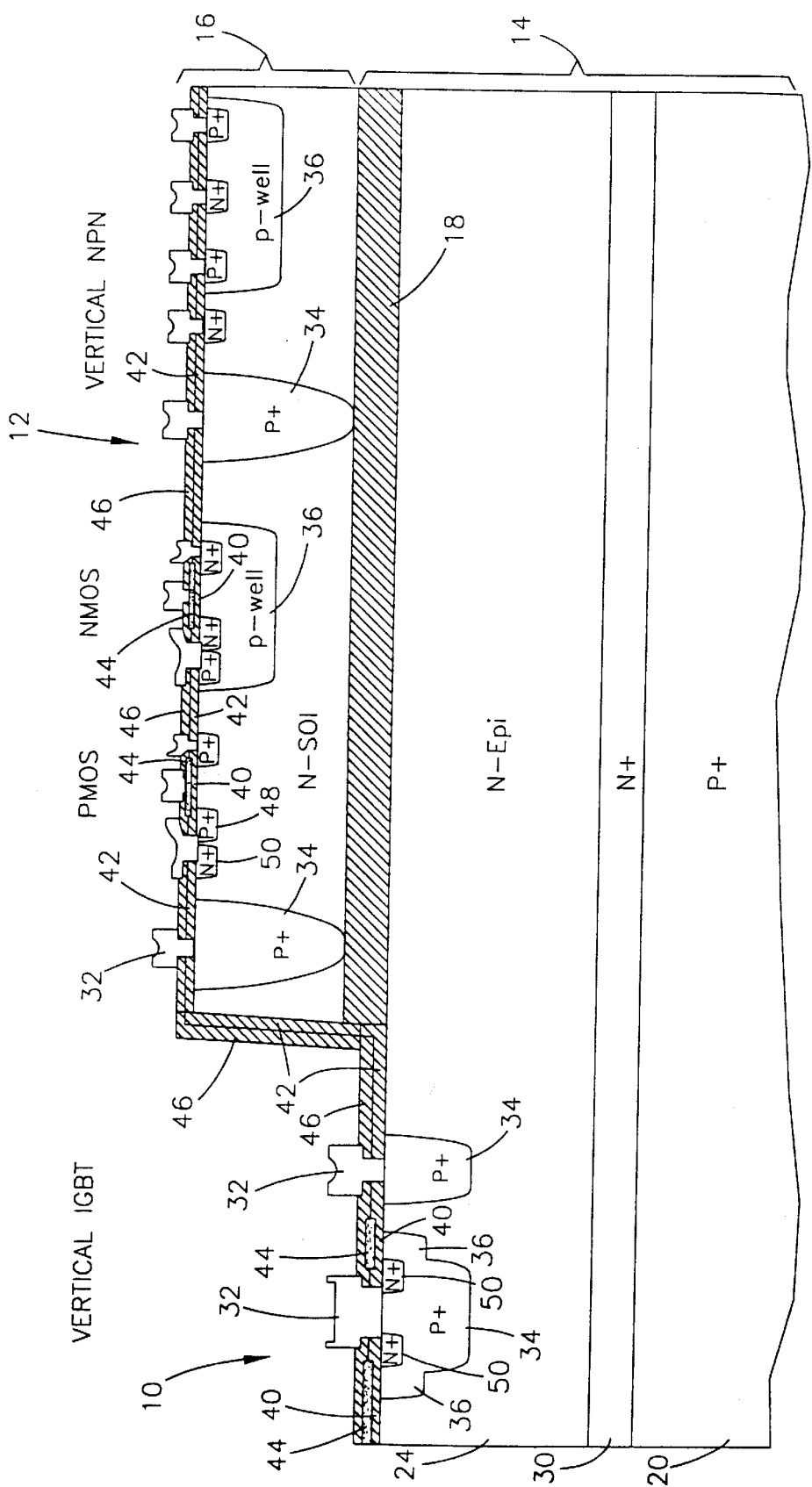
FIG. 1 represents a cross-sectional view of an IGBT device monolithically integrated with control circuitry in accordance with an embodiment of this invention.

Illustrated in FIG. 1 is a high voltage, vertical IGBT device 10 that is monolithically integrated with logic and control circuitry 12 in accordance with this invention. Though the invention will be described in terms of the IGBT device 10 and the control circuitry 12 shown in FIG. 1, those skilled in the art will realize that the teachings of this invention are applicable to the monolithic integration of other power devices with various other control circuitries.

As illustrated, the power device 10 and circuitry 12 are formed on two separate wafers 14 and 16, respectively. The circuitry 12 can be for the purpose of protecting the power device 10 from over-temperature, over-voltage and/or over-current conditions. As is apparent from FIG. 1, the wafers 14 and 16 are bonded together such that the power device 10 is both monolithically integrated with and dielectrically isolated from the circuitry 12 by a buried oxide layer 18, such that the upper wafer 16 is generally characterized as being silicon-on-insulator (SOI). In this manner, the power device 10 is formed in the lower or "handle wafer" 14 below the buried oxide layer 18, while the control circuitry 12 is formed in the upper or "SOI wafer" 16 above the buried oxide layer 18. Metallization 32 present on the SOI wafer 16 enables the circuitry 12 and the power device 10 to be electrically interconnected using such conventional methods as wire bonding or metallization.

Figure 2:
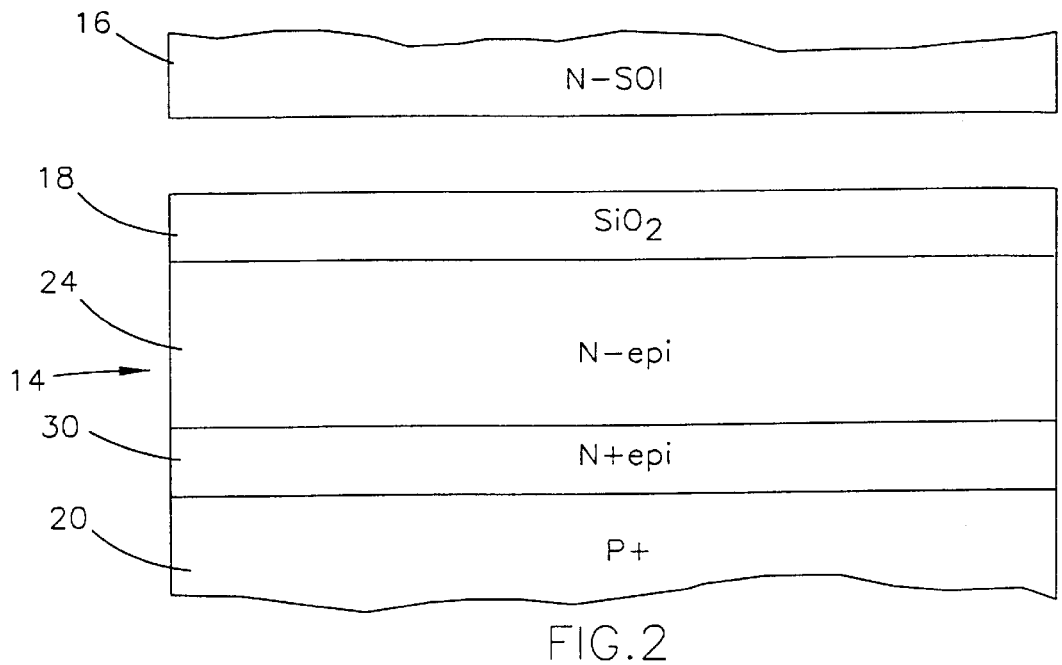
FIG. 2 represents wafers employed to form the device of FIG. 1, as they appear prior to being wafer-bonded.
Figure 3:
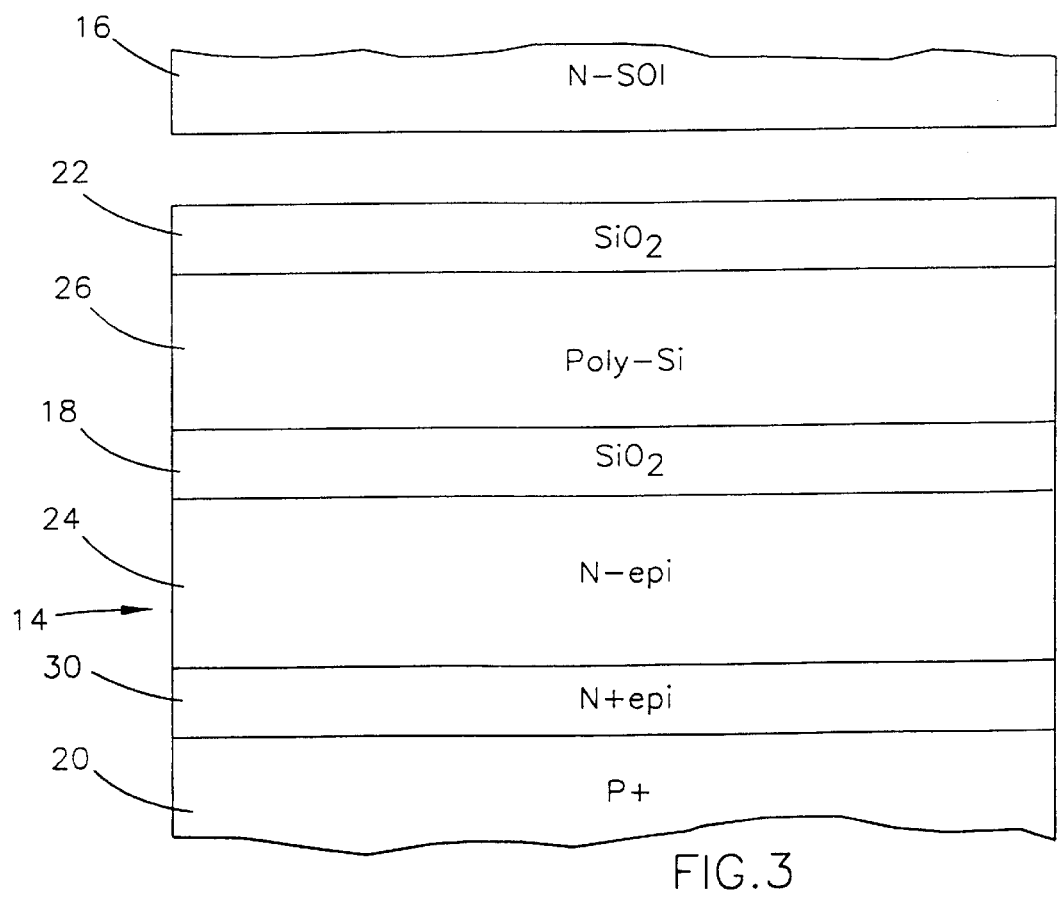
FIG. 3 represents wafers employed to form a device of the type shown in FIG. 1, but with the addition of a polysilicon shielding layer within the lower wafer in accordance with a second embodiment of this invention.
Figure 4:
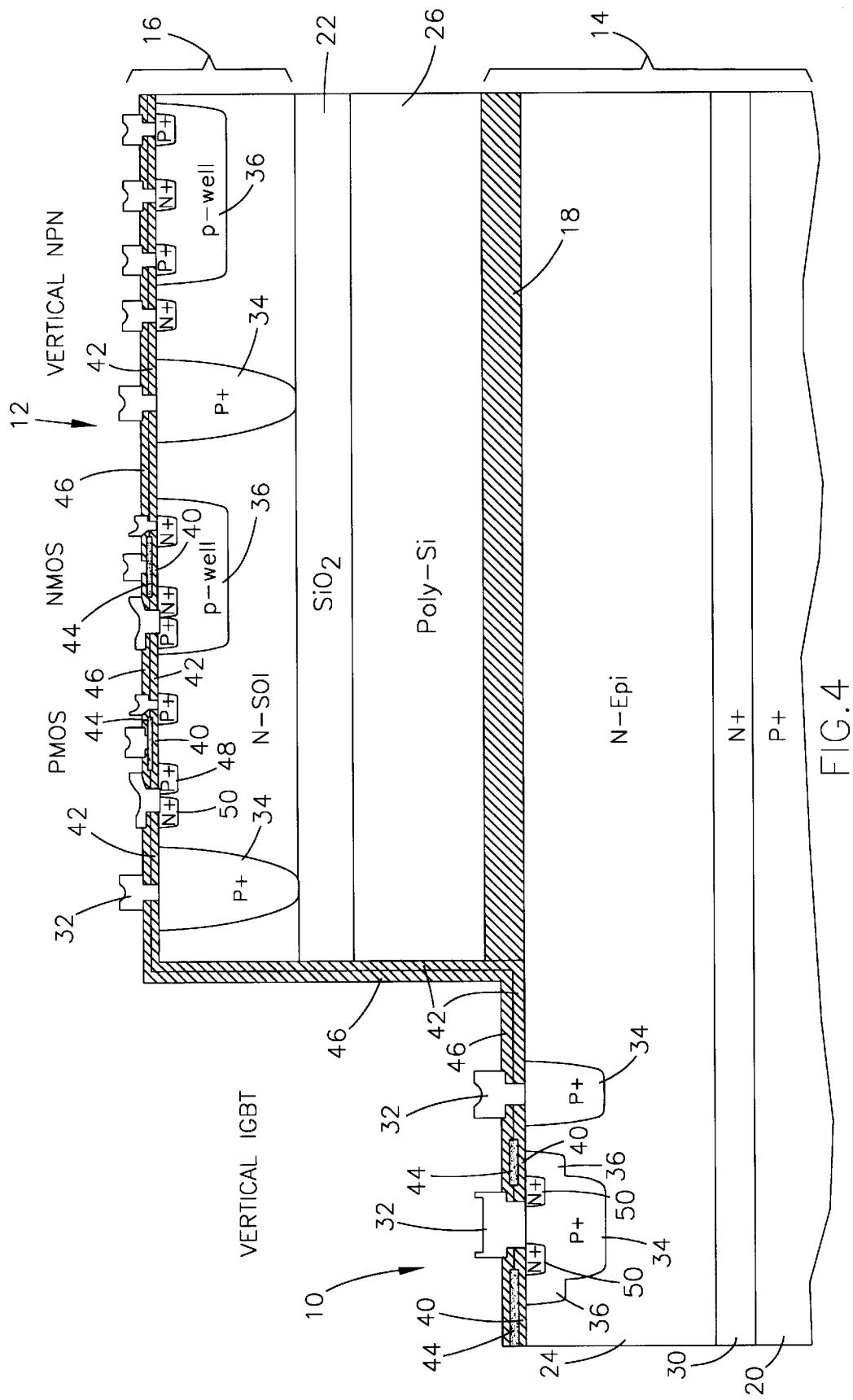
FIG. 4 represents a cross-sectional view of an IGBT device with a polysilicon shielding layer in accordance with the second embodiment of this invention.

As shown in FIGS. 1 and 2, the handle wafer 14 includes a silicon substrate 20 that serves as the anode for the power device 10, the buried oxide layer 18, and an epitaxial layer 24 disposed between the oxide layer 18 and the substrate 20. The substrate 20 preferably has a <100> crystallographic orientation and its characteristics are chosen to optimize the power device 10, since the substrate 20 does not affect the circuitry 12 on the SOI wafer 16. A suitable thickness for the substrate 20 is about 350 micrometers, and a suitable resistivity is about 0.01 ohm-centimeter. Shown in FIGS. 3 and 4 are optional polysilicon 26 and second oxide layers 22 above the oxide layer 18. As will be explained in fuller detail, the polysilicon layer 26 when grounded can advantageously serve as a shielding layer for the circuitry 12. For the IGBT device 10, the substrate 20 is preferably heavily doped p-type and has an epitaxially-grown N+ buffer layer 30 over which the epitaxial layer 24 (n-type) is grown, as is generally conventional for IGBT devices. Suitable thicknesses and resistivities for the buffer layer 30 and epitaxial layer 24 are about 10 micrometers and about 0.1 ohm-centimeter, and about 70 micrometers and about 30 ohm-centimeters, respectively.

The oxide layer 18 is thermally grown to a thickness that is governed by the maximum voltage of the substrate 20 and bonding considerations, a suitable thickness being about one micrometer. If employed as shown in FIGS. 3 and 4, the polysilicon layer 26 can be deposited to have a thickness of about 0.5 micrometers as amorphous silicon to promote the uniformity of the oxide layer 22 grown from its surface. In addition, the polysilicon layer 26 is preferably doped n-type to promote its conductivity. The oxide layer 22, if employed as shown in FIGS. 3 and 4, is thermally grown to a thickness governed by the maximum voltage of the circuitry 12 and bonding considerations, with a suitable thickness generally being about 0.4 micrometer.

In the context of the control circuitry 12 shown, the SOI wafer 16 is preferably a single crystal silicon wafer lightly-doped n-type to have a resistivity of about two ohm-centimeters. The SOI wafer 16 is shown in FIG. 1 as being direct wafer-bonded to the oxide layer 18 of the handle wafer 14, such that the oxide layer 18 and the epitaxial layer 24 are between the handle and SOI wafers 14 and 16, with the result that the oxide layer 18 forms the buried oxide layer 18 of FIG. 1. The characteristics of the SOI wafer 16 can advantageously be chosen to optimize the operation of the circuitry 12, since the SOI wafer 16 does not affect the operation of the power device 10 in the handle wafer 14. After bonding, the SOI wafer 16 is etched back to achieve a desired film thickness governed by the circuitry 12, generally on the order of about two to ten micrometers.

Processing steps for the fabrication of the power device 10 and circuitry 12 of FIG. 1 are generally as follows. The SOI wafer 16 must be etched in order to expose the surface or the handle wafer 14 in which the power device 10 is to be formed. Such an etch can be accomplished by patterning an oxide layer (not shown) on the surface of the SOI wafer 16 via a wet etch, such as an HF acid solution, and then employing the oxide layer as a mask through which the exposed portion or portions of the SOI wafer 16 are removed. TMAH (tetramethyl ammonium hydroxide) is a preferred etchant for its ability to cleanly and quickly etch silicon, and because the buried oxide layer 18 can serve as an effective etch-stop with a large tolerance for over etching. If the oxide layer 22 and polysilicon layer 26 of FIGS. 3 and 4 are present, a suitable etching technique would be to alternate HF and TMAH etches to sequentially remove these layers and expose the oxide layer 18.

After the desired portion of the SOI wafer 16 is removed, a conventional IGBT process can be used to fabricate the power device 10 in the epitaxial layer 24 and the circuitry 12 in the remaining portion of the SOI wafer 16. The oxide layer 18 that remains over the epitaxial layer 24 following etching of the SOI wafer 16 can be selectively etched to serve as a masking layer for predeposition of P+ regions 34 for the power device 10, and then subsequently removed to permit further fabrication of the power device 10. To minimize processing costs, the power device 10 and circuitry 12 may be fabricated simultaneously and share all process features, including a field oxide 42, gate oxides 40, a polysilicon layer 44, P+ sinker diffusions 34, P-well diffusions 36, P+diffusions 48, N+ diffusions 50, an interlevel dielectric 46, and the metallization 32. The metallization 32 may include bond pad areas to allow wire-bonding interconnections between the power device 10 and the control circuitry 12. One skilled in the art will appreciate that a variety of junction-isolated logic devices can be conventionally formed in the SOI wafer 16 in accordance with this invention, including the NMOS, PMOS and vertical NPN bipolar transistors shown in FIG. 1.

Key aspects of this invention include the implementation of a dual-plane lithography technique, which is necessitated by the circuitry 12 likely being located several micrometers above the surface of the handle wafer 14 in which the power device 10 is formed. While dual-plane lithography might be considered an obstacle to successful implementation of the present invention, it has been determined that the depth-of-field available using projection aligner technology is sufficient to simultaneously reproduce features on both wafers 14 and 16. In addition, slight modifications to the process by which resist is deposited, such as a thicker resist, a faster spread speed and/or a slower spin speed, have yielded acceptable resist coverage of both wafers 14 and 16 for patterning the features of the power device 10 and circuitry 12.

Another aspect of this invention is providing electrical interconnection between the power device 10 and its circuitry 12. One approach is to employ wire-bonding directly between bond pads formed on the power device 10 and circuitry 12. Such an approach is particularly attractive if only one or two interconnections between the power device 10 and the circuitry 12 are required, e.g., one for gate drive to the power device 10 and possibly one for current-sensing. Alternatively, and particularly if additional interconnections are desired, metal step coverage between the wafers 14 and 16 can be achieved using a dual-level metal technique, in which a resist, spin-on-glass, polyimide or a multilayer dielectric is used to provide a planarized die surface through which contact holes are formed for metallization. Alternatively, "stair steps" can be etched into the layers that project above the handle wafer 14, i.e., the buried oxide layer 18, the single-crystal silicon of the SOI wafer 16, and its oxide layers 42 and 46, in order to facilitate metallization.

Yet another important aspect of this invention is the isolation achieved between the power device 10 and the circuitry 12. The influence of the substrate voltage of the power device 10 will not pose a problem for many applications since the SOI wafer 16 is relatively thick and doped n-type. Under such circumstances, an accumulation layer will form above the buried oxide layer 18 to shield the circuitry 12 from the high voltage of the substrate 20. However, if the SOI wafer 16 is relatively thin—for example, the single-crystal silicon is thinned to about 0.5 micrometers or less for the fabrication of high-speed CMOS devices—it will generally be preferable to include the polysilicon and oxide layers 26 and 22 shown in FIGS. 3 and 4, the former of which can be grounded to provide a shielding layer between the circuitry 12 and the power device 10.

From the above, it is apparent that the process of this invention yields a fully-integrated monolithic structure that includes the power device 10 and its control circuitry 12. While a high-voltage vertical IGBT power device 10 is discussed and illustrated in the Figures, those skilled in the art will appreciate that the present invention can be applied to other vertical power devices, including DMOS and MOS-controlled thyristor devices. In addition, while conventional silicon processing materials can be employed to form the power device 10 and circuitry 12, it is foreseeable that other materials could be used, with the choice of materials determining the appropriate processes for forming selective regions of conductivity and resistance in the wafers. While the polarity of p-type and n-type regions in the wafers are generally interchangeable, each conductivity type incurs tradeoffs that would be appreciated and accommodated by one skilled in the art. Consequently, it is foreseeable that the present invention can be utilized to encompass a multitude of applications through the addition or substitution of other processing choices and technologies. Finally, there may be additional layers of passivation or protection required for manufacturability, as is known to those skilled in the art.

Therefore, while the invention has been described in terms of a preferred embodiment, it is apparent that other forms could be adopted by one skilled in the art. Accordingly, the scope of the invention is to be limited only by the following claims.

What is claimed is:

1. A semiconductor device comprising:

a first wafer comprising a silicon substrate, an epitaxial layer on the silicon substrate, a first dielectric layer on a first limited surface region of the epitaxial layer corresponding to a first surface region of the first wafer, a polysilicon layer on the first dielectric layer, and a second dielectric layer on the polysilicon layer;

a vertical power device formed in a second limited surface region of the epitaxial layer that remains exposed by the first dielectric layer, the polysilicon layer and the second dielectric layer, the second limited surface region of the epitaxial layer corresponding to a second surface region of the first wafer;

a second wafer bonded to the second dielectric layer of the first wafer such that the second surface region of the first wafer is exposed and such that the second dielectric layer, the polysilicon layer and the first dielectric layer of the first wafer are between the second wafer and the epitaxial layer of the first wafer, the second wafer having a surface that is parallel to and spaced apart from the second surface region of the first wafer in a direction substantially perpendicular to the second surface region of the first wafer; and control circuitry formed in the surface of the second wafer and electrically connected to the vertical power device;

wherein the first dielectric layer defines a buried oxide layer between the first and second wafers so as to form dielectric insulation between the vertical power device and the control circuitry, and wherein the polysilicon layer is grounded so as to provide a shielding layer between the first and second wafers.

2. A semiconductor device as recited in claim 1 wherein the substrate of the first wafer is of a first conductivity type, the first wafer further comprising a buffer layer of a second conductivity type between the substrate and the epitaxial layer.

3. A semiconductor device as recited in claim 1 wherein the second wafer is single crystal silicon.

4. A semiconductor device as recited in claim 1 wherein the surface of the second wafer is spaced at least one micrometer from the second limited surface region of the epitaxial layer.

5. A semiconductor device as recited in claim 1 wherein the vertical power device is an insulated-gate bipolar transistor.

* * * * *